United States Patent [19]

Gough

[11] Patent Number: 5,362,980

[45] Date of Patent: Nov. 8, 1994

[54] SEMICONDUCTOR COMPONENT WITH PROTECTIVE ELEMENT FOR LIMITING CURRENT THROUGH COMPONENT

[75] Inventor: Paul A. Gough, Smallfield, England

[73] Assignee: U.S. Philips Corporation, New York, N.Y.

[21] Appl. No.: 94,802

[22] Filed: Jul. 20, 1993

[30] Foreign Application Priority Data

Jul. 23, 1992 [GB] United Kingdom ............. 9215654.6

[51] Int. Cl.$^5$ .................... H01L 29/78; H01L 23/56; H01L 27/02; H01L 27/08
[52] U.S. Cl. .................. 257/355; 257/356; 257/467; 257/469; 257/470
[58] Field of Search ............... 257/173, 139, 467, 470, 257/469, 355, 356

[56] References Cited

U.S. PATENT DOCUMENTS

| | | | |
|---|---|---|---|
| 4,760,434 | 7/1988 | Tsuzuki et al. | 257/355 |
| 5,235,201 | 8/1993 | Honna | 257/355 |

FOREIGN PATENT DOCUMENTS

| | | | |
|---|---|---|---|
| 0271942 | 6/1988 | European Pat. Off. | |
| 0343977 | 11/1989 | European Pat. Off. | |
| 0392530 | 10/1990 | European Pat. Off. | |
| 0059770 | 4/1985 | Japan | 257/355 |

Primary Examiner—William L. Sikes
Assistant Examiner—Fetsum Abraham
Attorney, Agent, or Firm—Paul R. Miller

[57] ABSTRACT

A semiconductor component is formed by an insulated gate field effect device having a semiconductor body with a first region of one conductivity type adjacent one major surface, a second region defining a conduction channel area separating a third region from the first region, an insulated gate adjoining the conduction channel area for controlling current flow between the first and third regions and an injection region for injecting opposite conductivity type charge carriers into the first region, and a protection device for limiting the current through the insulated gate field effect device. The protection device is formed by a fourth region of the opposite conductivity type formed within the first region, a fifth region separated from the first region by the fourth region, a first conductive path connecting the fifth region to the insulated gate for allowing the flow of one conductivity type charge carriers towards the insulated gate and a second conductive path connected to the fourth region. An area of the fourth region beneath the fifth region provides a route for opposite conductivity type charge carriers to the second conductive path for causing, when the current through the insulated gate field effect device exceeds a predetermined limit, the pn junction between the fourth and first region to become forward biassed thereby causing the voltage at the insulated gate to alter so as to limit the current through the insulated gate field effect device.

16 Claims, 4 Drawing Sheets

SEMICONDUCTOR COMPONENT WITH PROTECTIVE ELEMENT FOR LIMITING CURRENT THROUGH COMPONENT

BACKGROUND OF THE INVENTION

This invention relates to a semiconductor component. In particular, this invention relates to a semiconductor component comprising an insulated gate field effect device and a protection device for regulating the current through the insulated gate field effect device so as, for example, to reduce the possibility of parasitic thyristor action, that is so-called latch-up, which could result in the ultimate destruction of the insulated gate field effect device.

EP-A-392530 discloses a drive circuit for an insulated gate field effect bipolar transistor (IGBT) in which a current sensor of unspecified type senses the current through the IGBT and provides an overcurrent signal to a control system, again of unspecified type, which acts to operate switches to reduce the gate drive voltage of the IGBT. As described in EP-A-392530, a zener diode is connected in a path between the main electrodes (normally known as the anode and cathode electrodes but referred to in EP-A-392530 as the collector and emitter electrodes) of the IGBT to restrict the current flow through the IGBT by providing a reactive current path. The zener diode is connected to the gate of an insulated gate field effect transistor (IGFET or MOS) which is turned on when the reactive current becomes sufficiently high to divert part of the supply current, thereby reducing the gate drive voltage applied to the IGBT.

The drive circuit described in EP-A-392530 is relatively complicated and requires external elements such as the control system and current sensor to operate. In addition, as the operation of the switches used to regulate the gate drive voltage is controlled via the external control system, the current regulation function of the drive circuit may function quite slowly.

It is an aim of the present invention to provide a semiconductor component which comprises an insulated gate field effect device, such as an IGBT, together with an integral protection device.

SUMMARY OF THE INVENTION

According to the present invention, there is provided a semiconductor component comprising an insulated gate field effect device having a semiconductor body with a first region of one conductivity type adjacent one major surface, a second region defining a conduction channel area separating a third region from the first region, an insulated gate adjoining the conduction channel area for controlling current flow between the first and third regions and an injection region for injecting charge carriers of the opposite conductivity type into the first region, and a protection device for limiting the current through the insulated gate field effect device, the protection device comprising a fourth region of the opposite conductivity type formed within the first region so as to be spaced from the second region, a fifth region separated from the first region by the fourth region and forming a potential barrier with the fourth region, a first conductive path connecting the fifth region to the insulated gate for allowing the flow of charge carriers of the one conductivity type towards the insulated gate and a second conductive path connected to the fourth region, an area of the fourth region beneath the fifth region providing a route for charge carriers of the opposite conductivity type to the second conductive path for causing, when the current through the insulated gate field effect device exceeds a predetermined limit, the flow of opposite conductivity type charge carriers beneath the fifth region to become sufficient to forward bias the pn junction between the fourth and first regions to cause the voltage at the insulated gate to alter so as to limit the current through the insulated gate field effect device.

In a semiconductor component in accordance with the invention, the protection device is integrated in the same semiconductor body as the insulated gate field effect device and the current through the insulated gate field effect device directly affects the protection device so that when that current exceeds the predetermined limit, the forward biassing of the pn junction between the first and fourth regions causes the parasitic bipolar transistor provided by first, fourth and fifth regions to turn on so as to directly reduce the gate voltage and thus limit the current through the insulated gate field effect device. Such a semiconductor component is relatively simple to make and allows the limiting current to be selected by choosing the geometry and doping of the protection device. Moreover, an integrated protection device should respond more quickly than an external control system. In addition as the temperature of the semiconductor component increases, the protection device will act to limit the current at a lower current because the potential required to turn on the parasitic bipolar transistor reduces with temperature and the resistance to the flow of opposite conductivity type charge carriers through the fourth region increases with temperature because of increased scattering and other effects.

Preferably, the first conductive path comprises a rectifying element for preventing the flow of one conductivity type charge carriers from the insulated gate to the fifth region. This should assist in preventing turn on of the parasitic bipolar transistor provided by the protection device when the voltage at the insulated gate of the insulated gate field effect device is such that no conduction along the conduction channel area should occur; for example where the one conductivity type is n type, when the gate voltage is zero.

The second conductive path may be connected to the same potential as an electrode connected to the third region of the insulated gate field effect device and could be directly connected to the third region.

The protection device may simply comprise the fourth and fifth regions with conductive tracks, for example metal tracks, providing the first and second conductive paths. As one possible alternative, the protection device may comprise an insulated gate field effect transistor having a sixth region forming a potential barrier with the fourth region and being spaced from the fifth region by a conduction channel area of the fourth region and an insulated gate adjoining the conduction channel area, the sixth region being electrically shorted to the fourth region by the second conductive path. The latter arrangement may be simpler to implement, and may, for example, merely require alterations to the metallisation mask to provide the necessary first and second conductive paths, if the semiconductor component is in any case to include logic or control components in the form of MOS transistor. Moreover, where the protection device has such a transistor structure, then the insulated gate of the protection device may be separately controlled, for example by being connected to the output of an over-temperature circuit which may be an external or integrated circuit, so that when the appropriate voltage is applied to the insulated gate of the protection device a conduction channel is established effectively shorting the sixth and fifth regions causing the protection device to pull down the voltage at the insulated gate of the insulated gate field effect device thereby limiting its current in response to the signal from the control circuit connected to the insulated gate of the protection device. However, the absence of an insulated gate should provide the former arrangement with a higher breakdown voltage for the junction between the fourth and fifth region.

The fifth region is preferably a region of the one conductivity type formed within the fourth region but could possibly be a layer provided on the fourth region and forming a potential barrier therewith, for example a doped semiconductor layer forming a pn junction with the fourth region or a conductive layer forming a Schottky barrier with the fourth region. The sixth region will generally be similar to the fifth region and is preferably a region of the one conductivity type formed within the fourth region.

Generally, the insulated gate field effect device may comprise a number of device cells each having a second region defining a conduction channel area separating a respective third region from the first region and an insulated gate provided over the conduction channel area, the second regions of adjacent device cells being spaced apart from one another by the first region, and the insulated gates being connected together to form an insulated gate structure with sections of the insulated gate structure extending over the first region between adjacent second regions.

Generally, the second regions are of the opposite conductivity type so that the insulated gate field effect device is of the enhancement or normally off type.

In a manner similar to the fifth region the or each third region is preferably a region of the one conductivity type formed within the or the associated second region but could possibly be a layer provided on the second region and forming a potential barrier, for example a doped semiconductor layer forming a pn junction or a conductive layer forming a Schottky barrier, with the associated second region.

In such a case, where the second regions are of the opposite conductivity type and the device cells are formed by introducing at least some of the impurities to .form the second regions using the insulated gate structure as a mask, the protection device may be formed by making the section of insulated gate structure between first and second adjacent device cells so narrow that the second regions of the first and second device cells merge to form the fourth region. Such an arrangement provides a very simple way of forming the protection device.

The second region of each device cell may have a central more highly doped subsidiary region which is omitted from the one of the first and second device cells in which the fifth region is situated thereby increasing the breakdown voltage of the pn junction between the first and fourth regions.

The predetermined current through the insulated gate field effect device at which the protection device acts to limit the current may be adjusted by altering the geometry of the first and second device cells so as to, for example, increase the resistance of the path through the fourth region beneath the fifth region. This may be achieved by making the second regions of the device cells forming the protection device smaller than the remaining device cells in a direction parallel to the width of the conductive path provided by the conduction channel area of the insulated gate field effect device.

BRIEF DESCRIPTION OF THE DRAWINGS

Embodiments of the invention will now be described, by way of example, with reference to the accompanying drawings, in which.

Figure 1:
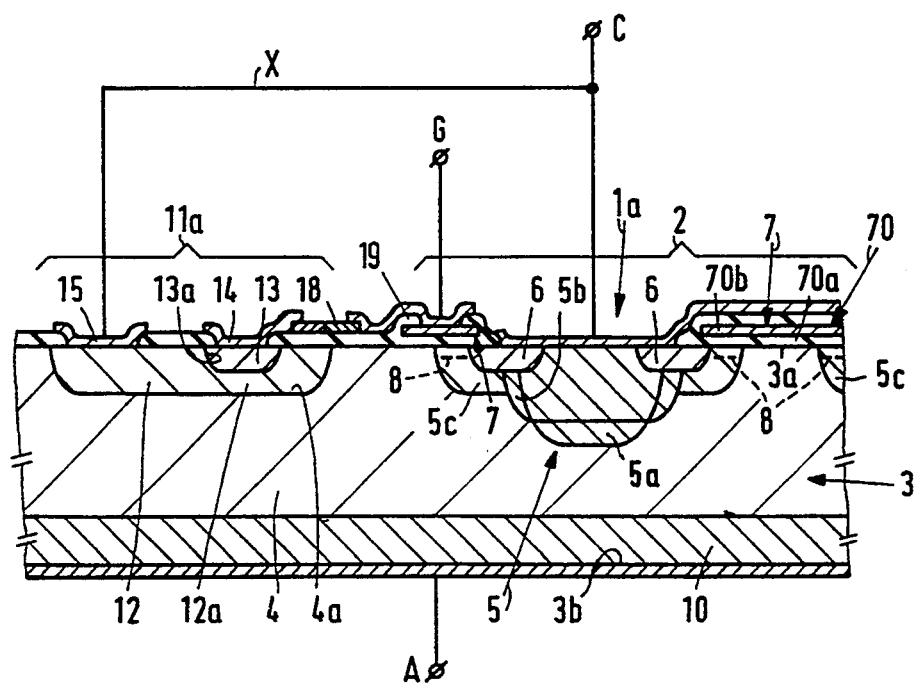
FIG. 1 is a cross-sectional view through part of a semiconductor body of a first embodiment of a semiconductor component in accordance with the invention.

It should of course be understood that the Figures are merely schematic and are not to scale and that certain dimensions, for example the thicknesses of layers, may have been relatively exaggerated in the interests of clarity.

Similar reference numerals are used throughout the drawings to refer to similar parts.

DETAILED DESCRIPTION OF THE PREFERRED EMBODIMENT

Referring now to FIGS. 1 to 4, a semiconductor component 1a,1b,1c,1d comprises an insulated gate field effect device 2 having a semiconductor body 3 with a first region 4 of one conductivity type adjacent one major surface 3a, a second region 5 defining a conduction channel area 8 separating a third region 6 from the first region 4, an insulated gate 7 adjoining the conduction channel area 8 for controlling current flow between the first and third regions 4 and 6 and an injection region 10 for injecting charge carriers of the opposite conductivity type into the first region 4, and a protection device 11 for limiting the current through the insulated gate field effect device 2, the protection device 11a, b, c or d comprising a fourth region 12 of the opposite conductivity type formed within the first region 4 so as to be spaced from the second region 5, a fifth region 13 separated from the first region 4 by the fourth region and forming a potential barrier with the fourth region 12, a first conductive path 14 connecting the fifth region to the insulated gate 7 for allowing the flow of charge carriers of the one conductivity type towards the insulated gate 7 and a second conductive path 15 connected to the fourth region 12, an area 12a of the fourth region 12 beneath the fifth region 13 providing a route for charge carriers of the opposite conductivity type to the second conductive path 15 for causing, when the current through the insulated gate field effect device 2 exceeds a predetermined limit, the flow of opposite conductivity type charge carriers beneath the fifth region 13 to become sufficient to forward bias the pn junction between the fourth 12 and first 4 regions to cause the voltage at the insulated gate 7 to alter so as to limit the current through the insulated gate field effect device 2.

In a semiconductor component in accordance with the invention, the protection device 11a, b, c or d is integrated in the same semiconductor body 3 as the insulated gate field effect device 2 and the current through the insulated gate field effect device 2 directly affects the protection device so that, when that current exceeds the predetermined limit, the forward biassing of the pn junction 4a between the first 4 and fourth 12 regions causes the parasitic bipolar transistor provided by fourth 12, fifth 13 and first 4 regions to turn on so as to directly reduce the gate voltage and thus limit the current through the insulated gate field effect device. Such an integrated protection device should respond more quickly than an external control system. In addition as the temperature of the semiconductor component 1 increases, the protection device 11 will act to limit the current at a lower current because the potential required to turn on the parasitic bipolar transistor reduces with temperature and the resistance to the flow of opposite conductivity type charge carriers through the fourth region 12 increases with temperature due to scattering and other thermal effects.

Referring now specifically to the drawings, FIG. 1 illustrates, by way of a cross-section through part of the semiconductor body 3, a first embodiment of a semiconductor component 1a in accordance with the invention.

In this example, the insulated gate field effect device 2 comprises an IGBT of the planar type, that is where the insulated gate 7 is provided on one 3a of two major surfaces 3a and 3b of the semiconductor device.

The IGBT 2 may have any suitable structure. In the case shown, the IGBT comprises a relatively highly doped monocrystalline silicon substrate of the opposite conductivity type, p conductivity type in this example, which forms the injection region 10. The first region 4 is formed as a relatively lowly doped epitaxial silicon layer of the one conductivity type, n conductivity type in this case, on the substrate 10.

The IGBT 2 shown in FIG. 1 is designed to be capable of carrying high currents and is a so-called vertical power semiconductor device in which the main current path is between the two major surfaces 3a and 3b of the semiconductor body 3. As is known in the art, such a power IGBT 2 consists of many, typically hundreds of thousands, of parallel-connected device cells 17 only one of which is shown in FIG. 1. Each device cell 17 comprises a second or body region 5 within which is formed a third or cathode region 6 so that together the second and third regions 5 and 6 define a conduction channel area 8 over which an insulated gate 7 is provided. In this example, the IGBT is of the enhancement or normally off type and so the second regions 5 are of the opposite conductivity type, p conductivity type in this case. The third regions 6 are, in this example, n conductivity regions each formed within a respective second region 5. The insulated gates 7 are connected together to define an insulated gate structure 70. A covering insulating layer 19 is deposited and, after opening of contact windows, metallisation is provided and patterned on the major surface 3a to define a cathode electrode C connecting all the third regions in parallel and a gate electrode G (shown only schematically) connected to the conductive layer 70b of the insulated gate structure 70. Further metallisation defines an anode electrode A on the other major surface 3b.

The device cells 17 may have any desired geometry, for example square or hexagonal, when viewed in plan (that is looking down upon the surface 3a).

As will be appreciated by those skilled in the art, the substrate 10 forms the common injection or anode region of the IGBT while the third regions 6 form the cathode regions and, by comparison with the power MOSFET terminology, the first region 4 forms the drain drift region of the IGBT.

The IGBT 2 may be formed using any suitable technology. In this example, the IGBT 2 is formed by using a technology equivalent to the so-called DMOS technology used for MOSFETs. Thus, the insulated gate structure (which generally comprises a thermal oxide layer 70a followed by a doped polycrystalline silicon conductive layer 70b) is used as at least part of the mask for the introduction, generally implantation, of at least some of the impurities to form the second and third regions 5 and 6 so that the conduction channel areas 8 are defined by the lateral diffusion of impurities beneath the insulated gate structure 70 and so are automatically aligned to the insulated gate structure 70.

As is known in the art, each second or body region 5 may have a central more highly doped relatively subsidiary region 5a to which, as can be seen from the Figures, the cathode region 6 is electrically shorted by the cathode electrode C so as to inhibit parasitic bipolar action. So as to increase even further the ruggedness (resistance to breakdown) of the IGBT, each body region 5 may have a relatively highly doped but relatively shallow subsidiary region 5b which is formed by introducing appropriate impurities after definition of the insulated gate structure but with the mask still in place so as to ensure that the relatively highly doped but relatively shallow subsidiary region 5b does not extend into the conduction channel area 8. After removal of the insulated gate structure defining mask, impurities are introduced to form a relatively lowly doped shallow subsidiary region 5c and the third region 5 so that each conduction channel area 8 is defined between a respective relatively lowly doped shallow subsidiary region 5c and the associated third region 6.

The protection device 11 is formed integrally with the IGBT 2 and in this example, by appropriate modification of the respective masks, the fourth region 12 is formed at the same time and has the same dopant concentration and depth characteristics as the relatively shallow subsidiary region 5c of the IGBT while the fifth region 13 is formed at the same time and has the same dopant concentration and depth characteristics as the cathode or third regions 6 of the IGBT 2. In this example, the first and second conductive paths 14 and 15 are in the form of metal contacts defined from the metallisation provided to form the cathode and gate electrodes C and G.

The first conductive path 14 is connected to the insulated gate electrode G via a rectifying element 18 which allows the flow of electrons towards the insulated gate but not in the reverse direction. In the example illustrated, the rectifying element 18 is a diode which may be, for example, a separate discrete component or could be, as shown in FIG. 1, a thin-film (for example polycrystalline silicon) diode formed on and insulated from the semiconductor body by the insulating layer 19.

The second conductive path 15 is typically connected, by appropriate patterning of the metallisation, to the cathode electrode C.

In operation of the semiconductor component 1a shown in FIG. 1, when current is flowing in the IGBT 2, holes injected into the drain drift region 4 from the anode region 10 will travel through the fourth region 12, in particular through an area 12a of the fourth region 12 beneath the fifth region 13, and out of the second conductive path 15 which is, as shown by the connection line X in FIG. 1, connected to the cathode electrode C of the IGBT 2. When the IGBT 2 is turned on or conducting, the fifth region 13 will typically (for a conventional IGBT) be at 15 volts and so the pn junction 13a between the fourth and fifth regions 12 and 13 will be strongly reverse-biassed and is unlikely to become forward-biassed even at high current. However, if the current through the IGBT 2 reaches a predetermined limit Ic, then the hole current through the area 12a causes a sufficient potential drop across the pn junction 4a between the first region 4 and the fourth region 12 to forward bias the pn junction 4a because the fourth region 12 is at a much lower potential, generally closer to 0 (zero) volts. When this occurs, electrons will flow from the first region 4 into the fifth region 13 and the parasitic bipolar transistor formed by the first 4, fourth 12 and fifth 13 regions will turn on. By virtue of the first conductive path 14, this electron current pulls down or reduces the voltage at the insulated gate electrode G thereby causing the current through the IGBT to be limited (that is the current increases less steeply and tends towards an asymptotic value) until the flow of holes through the area 12a of the fourth region 12 is insufficient to maintain the forward biassing of the pn junction 4a.

The current through the IGBT 2 is thus limited by the protection device 11a to a predetermined maximum. This predetermined maximum is determined mainly by the hole current necessary to forward bias the pn junction 4a and may be adjusted or altered by, for example, adjusting the dopant concentration of the fourth region 12 and/or by altering the geometry of the fourth region 12 so as to make the path through the fourth region 12 more or less resistive thereby reducing or increasing the predetermined current at which the protection device 11 is turned on to effect current limiting. In order to reduce the predetermined current, the geometry may be altered by making the fourth region longer in the direction of flow of the hole current and/or by making the path through the fourth region 12 more narrow.

In addition, as the temperature of the semiconductor component 1a increases, the protection device will cause current limiting at a lower IGBT current because the potential at which the pn junction 4a forward biasses decreases with increasing temperature while the resistance to hole flow through the fourth region 12 increases with temperature. Thus, a protection device in accordance with the invention acts to inhibit thermal runaway.

The rectifying element 18 acts to protect the pn junction 12a between the fourth and fifth regions 12 and 13 from forward biassing when the voltage at the insulated gate electrode G is low, in particular when the IGBT 2 is not conducting, that is in this example, when the insulated gate electrode G is at zero volts or slightly negative in the case of an n-channel device.

As indicated above, the protection device 11a shown in FIG. 1 may be formed by appropriate modification of the masks used to form the relatively shallow relatively lowly doped subsidiary regions 5c, the third region 6 and the cathode and gate electrodes. However, if the IGBT 2 is to be a so-called Smart device in which logic and control circuitry may be integrated into the semiconductor body so as to enable functions of the IGBT 2 to be monitored and such logic or control circuitry involves the use of enhancement mode (normally off) lateral insulated gate field effect transistors (IGFETs), then one of these may be used to form the protection device.

Figure 2:
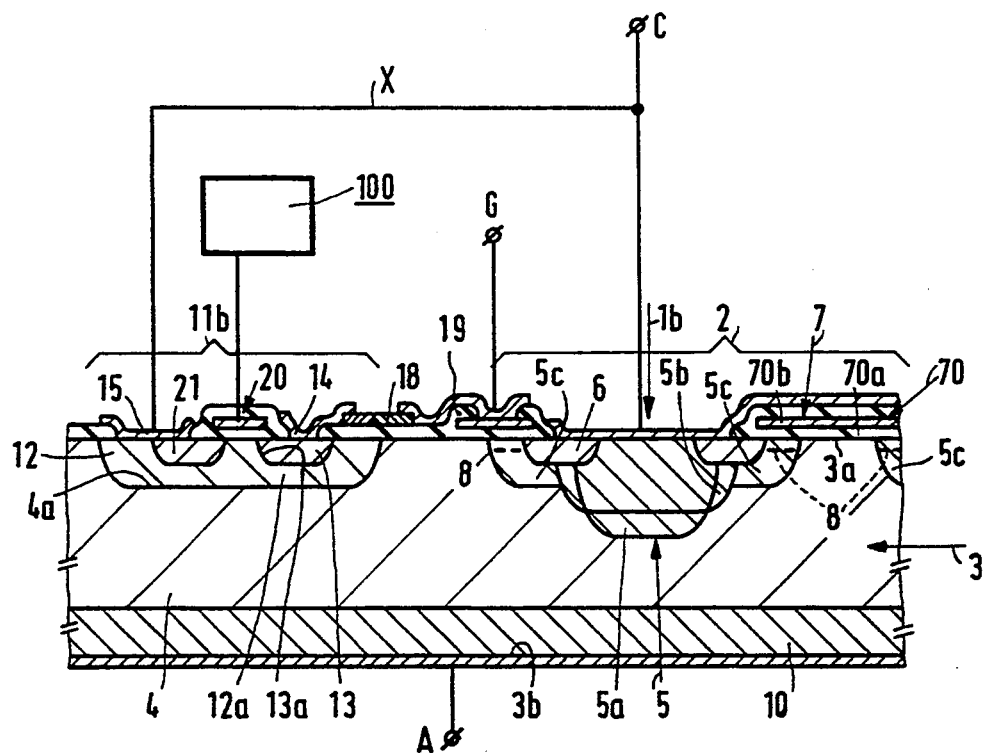
FIG. 2 is a cross-sectional view through part of a semiconductor body of a second embodiment of a semiconductor component in accordance with the invention.

FIG. 2 illustrates an example of a semiconductor component 1b which is similar to that shown in FIG. 1 but in which the protection device 11b has the form of, in this example, an n channel IGFET or MOS transistor with an insulated gate 20 formed at the same time as the insulated gate structure 70 and with the fifth region 13 being formed at the same time as a sixth region 21 so that the fifth and sixth regions 13 and 21 form the drain and source regions respectively of the IGFET 11b. The source region 21 is shorted to fourth region 12 so as to inhibit undesired parasitic bipolar action between the sixth, fourth and fifth regions. The insulated gate 20 of the IGFET 11b may be connected to a suitable reference potential, generally earth (ground) which avoids inducing a conduction channel, or may be connected to a control circuit, as indicated schematically by the box 100 in FIG. 2, which provides a control signal for separately controlling the insulated gate. The control circuit may be an external component or could be integrated in the same semiconductor body 3. As one example, the control circuit may comprise a temperature sensor which senses the temperature of the IGBT 2 and, when this temperature exceeds a desired value, provides a control signal to raise the voltage at the insulated gate 20 of the protection device 11b thereby inducing a conduction channel between the fifth and sixth regions 13 and 21, effectively shorting these regions and thus the first and second conductive paths 14 and 15 together so that the protection device 11b tries to pull down or reduce the voltage at the insulated gate electrode G of the IGBT 2 thereby limiting the current through the device. Thus, in this example, the protection device 1b can be used in conjunction with a temperature sensor to inhibit excessive rise in the IGBT 2 temperature by limiting the current through the IGBT 2 when an excessive temperature is detected by the sensor. Any suitable form of temperature sensor may be used, for example one of the temperature sensing circuits described in EP-A-369530 (PHB33507) or our copending unpublished European patent Application No. 92202111.8 (PHB33790) or the differential temperature sensor described in EP-A-479362 (PHB33667).

When a control signal is not supplied to the insulated gate 20 of the protection device 11b or the insulated gate 20 is connected to a reference potential the protection device 11b shown in FIG. 2 functions in the same manner as the protection device 11a shown in FIG. 1 and thus its operation will not be discussed further.

Although the protection device 11b may be more easily incorporated into the IGBT mask set and enables separate control of the protection device 1b via a connection to its insulated gate 20 as discussed above, the protection device 11a shown in FIG. 1 may have advantages in that the absence of an insulated gate should enable a higher breakdown voltage to be achieved for the pn junction 4a.

Figure 3:
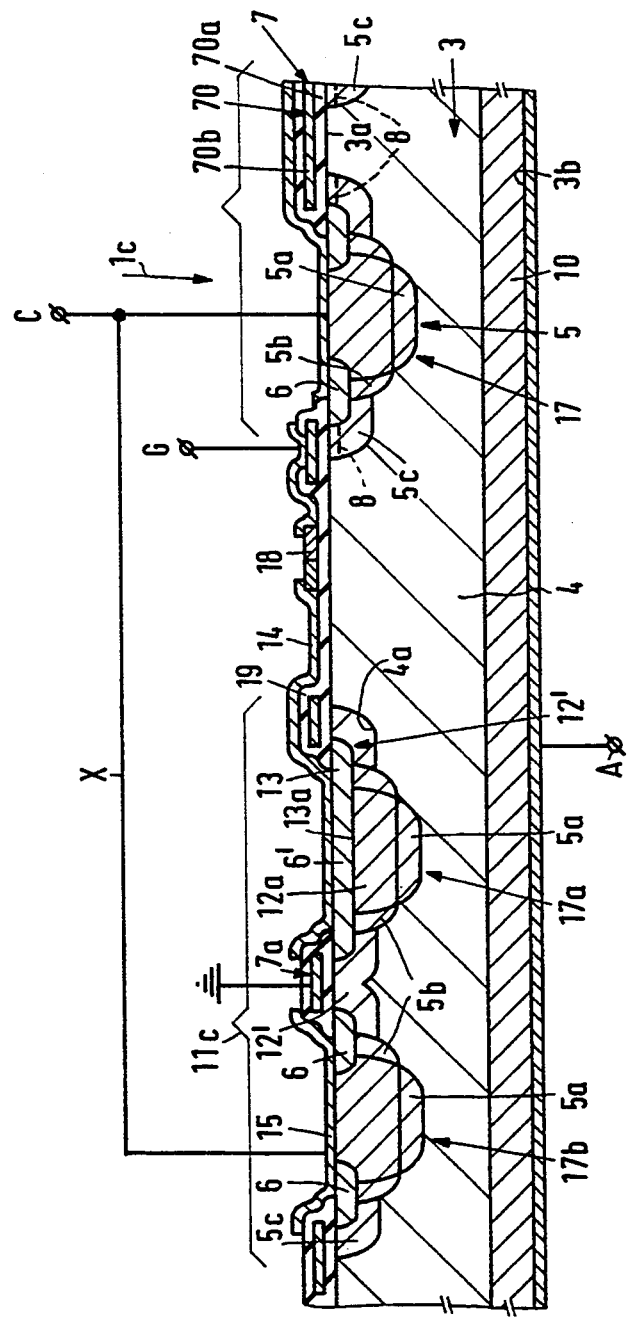
FIG. 3 is a cross-sectional view through part of a semiconductor body of a third embodiment of a semiconductor component in accordance with the invention.

FIG. 3 illustrates a further embodiment 1c of a semiconductor component in accordance with the invention.

In the example shown in FIG. 3, the protection device again has the form of an IGFET but in this case the protection device 11c is formed by modified forms of the device cells 17 of the IGBT 2 in which the insulated gate 7a between first and second adjacent device cells 17a and 17b is formed to be so narrow that the relatively shallow subsidiary regions 5c of the second regions 5 of the two device cells 17a and 17b merge to form the fourth or well region 12' while the third regions 6 of the two device cells 17a and 17b form the source and drain regions of the protection device 11c. Thus, one 6' of these third regions also forms the fifth region 13.

It will be appreciated that the insulated gate 7a of the protection device 1c will not be connected to the insulated gate 7 of the IGBT 2 but will, by appropriate patterning of the gate conductive layer 70b be formed separately therefrom. As in the example described with reference to FIG. 2, the insulated gate 7a of the protection device 1c may be connected to earth (ground) as shown or to a control unit as shown in FIG. 2.

Generally, as indicated above, the cathode region 6 of each device cell 17 is shorted to the associated second region 5 by the cathode electrode C. This may be achieved, as is known in the art by masking a central area of each device cell 17 from the impurities introduced to form the cathode regions 6 as shown or by etching a central moat through the cathode regions 6 to expose an underlying area of the second regions 5.

In the case of the one 17a of the first and second device cells 17a and 17b in which the fifth or drain region 13 is situated this short is omitted so that when the metallisation is patterned, the metallisation forming the first conductive path 14 contacts only the drain region 13 of the IGFET 11c.

The semiconductor component 1c operates in the same way as those described above with reference to FIGS. 1a and 1b but has the additional advantage that the protection device 11c may be formed from the IGBT device cells with very little modification.

The protection device 11c shown in FIG. 3 may be capable of withstanding only relatively low reverse-biassing voltages because the breakdown voltage of the pn junction 12a will be relatively small possibly, of the order of 5 volts. This limits the maximum allowable voltage swing for the insulated gate electrode G so that it may only be possible to reduce the gate voltage from say 15 to 10 volts in order to achieve current limiting.

Figure 4:
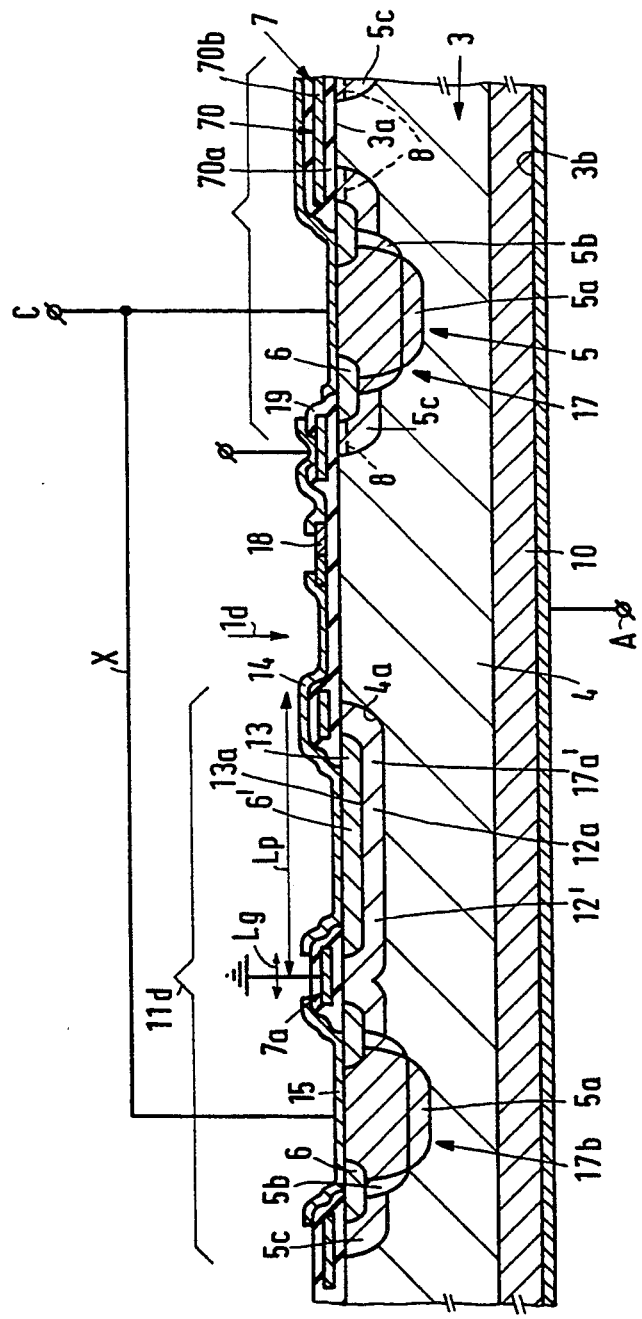
FIG. 4 is a cross-sectional view through part of a semiconductor body of a fourth embodiment of a semiconductor component in accordance with the invention.

It is therefore desirable to increase the breakdown voltage of the pn junction 12a and this may be achieved by, for example, appropriate modification of the respective masks so that the relatively highly doped subsidiary regions 5a and 5b are omitted from the device cell 17'a at the drain end of the IGFET 11d forming the protection device as in the semiconductor component 1d shown in FIG. 4. As a further measure, the dopant concentration of the relatively shallow relatively lowly doped subsidiary region 5c of the device cell 17'a could be reduced although this would require an extra masking step to mask that region 5c of the device cell 17'a from the subsequent implants for the other relatively lowly doped subsidiary regions 5c.

Computer simulations have been carried out on a semiconductor component similar to the component 1d shown in FIG. 4 to model the current flow through the protection device 11d which results when the pn junction 4a becomes forward-biassed due to the flow of holes from the anode region 10 through the fourth region 12 to the second conductive path 15. The results of these simulations showed that the forward-biassing occurs first immediately below the fifth (drain) region 13, that is where the electron current is highest. This understanding enables the geometry of the protection device to be adjusted to achieve a desired predetermined current at which limiting occurs. Thus, the current at which the protection device 11d turns on can be increased by:

1) reducing the dimension of the fourth region 12 in the direction of flow of the hole current so as to reduce the resistance to hole flow,
2) ensuring a good overlap between the second regions 5 of the first and second device cells 17'a and 17b to reduce the resistance of the overlap area,
3) increasing the dopant concentration in the fourth region 12 (at the expense of a reduction in the breakdown voltage),
4) reducing the carrier lifetime by, for example, introducing recombination centres (by irradiating implantation of heavy metal such as gold or platinum) into the drain drift region 4.

Figure 5:
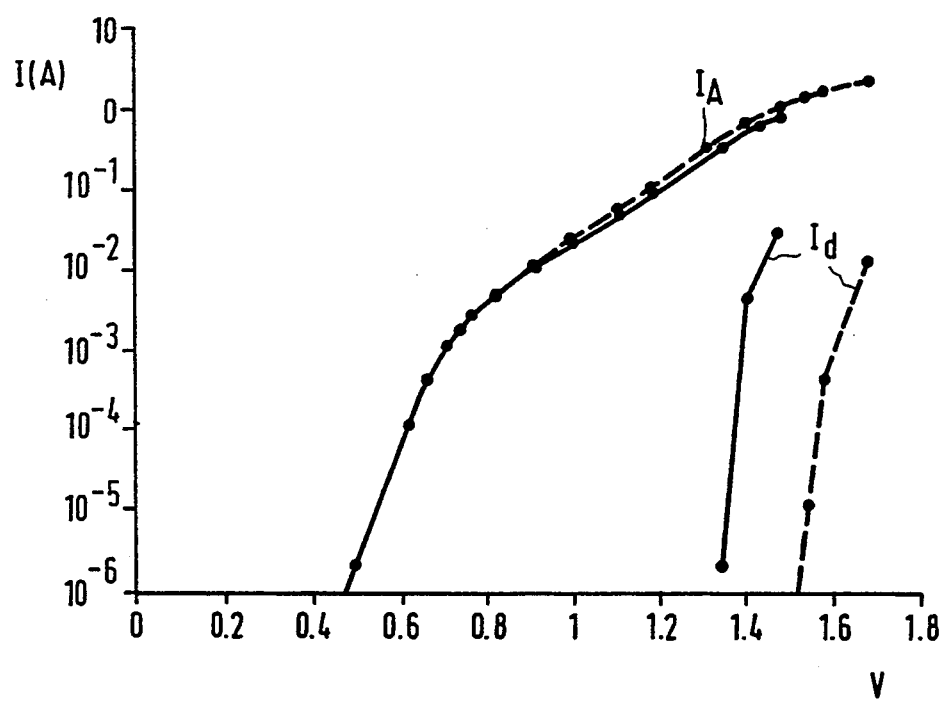
FIG. 5 illustrates graphically the change in current through the insulated gate field effect device and the protection device with voltage across the insulated gate field effect device for two different protection device geometries.

FIG. 5 illustrates graphically the change in the anode current $I_A$ of the IGBET 2 and the drain current Id of the IGFET 11d of one cell of the semiconductor component Id with change in the voltage at the anode electrode, where the drain voltage is held at 15 volts. The solid lines indicate the results obtained for the component A with a gate width Lg (see FIG. 4) of 6 $\mu$m (micrometers) and a half cell width Lp (see FIG. 4) of 12 $\mu$m while the dashed lines indicate the results obtained for component B with a gate width Lg of 4 $\mu$m and half cell width of 8 $\mu$m.

It can be seen that for component A the parasitic transistor formed by the first, fourth and fifth regions 4,12 and 13 turns on at an anode voltage of just below 1.4 V. For an IGBT with 3200 cells this corresponds to a current of 12 A (12 Amps). In contrast for component B, the anode voltage at turn on of the protection device 11a has increased to above 1.5 V which corresponds to a amount of 30 A for an IGBT with 3197 cells.

The current at which the protection device 11d turns on may be increased further by increasing the implantation dose for the fourth region 12 (thereby reducing the resistance to holes).

In the examples illustrated each protection device 11a,11b,11c or 11d consists of a single cell, however several similar such cells may be provided and, for example, distributed amongst the IGBT 2 cells 17.

Although the present invention has been described above with reference to planar IGBTs that is IGBTs in which the insulated gate is provided on one major surface of the semiconductor body the present invention may also be applied to so-called Trench type devices where the insulated gate is provided over the surface of a groove or trench which extends through cathode and body regions into the drain drift region. The present invention may also be applied to so-called anode-shorted IGBTs.

The present invention could also be applied to other types of insulated field effect devices employing injection of opposite conductivity type charge carriers—so called conductivity modulation.

It will of course be appreciated that the conductivity types given above may be reversed and that semiconductor materials other than silicon may be used.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A semiconductor component comprising an insulated gate field effect device having a semiconductor body with a first region of one conductivity type adjacent one major surface, a second region defining a conduction channel area separating a third region from the first region, an insulated gate adjoining the conduction channel area for controlling current flow between the first and third regions and an injection region for injecting charge carriers of the opposite conductivity type into the first region, and a protection device for limiting the current through the insulated gate field effect device, the protection device comprising a fourth region of the opposite conductivity type formed within the first region so as to be spaced from the second region, a fifth region separated from the first region by the fourth region and forming a potential barrier with the fourth region, a first conductive path connecting the fifth region to the insulated gate for allowing the flow of charge carriers of the one conductivity type towards the insulated gate and a second conductive path connected to the fourth region, an area of the fourth region beneath the fifth region providing a route for charge carriers of the opposite conductivity type to the second conductive path for causing, when the current through the insulated gate field effect device exceeds a predetermined limit, the flow of opposite conductivity type charge carriers beneath the fifth region to become sufficient to forward bias the pn junction between the fourth and first regions to cause the voltage at the insulated gate to alter so as to limit the current through the insulated gate field effect device.

2. A component according to claim 1, wherein the first conductive path comprises a rectifying element for preventing the flow of one conductivity type charge carriers from the insulated gate of the insulated gate field effect device to the fifth region.

3. A component according to claim 1, wherein the second conductive path is connected to the same potential as an electrode connected to the third region of the insulated gate field effect device.

4. A component according to claim 1, wherein the protection device comprises an insulated gate field effect transistor having a sixth region forming a potential barrier with the fourth region and being spaced from the fifth region by a conduction channel area of the fourth region, and an insulated gate adjoining the conduction channel area, the sixth region being electrically shorted to the fourth region by the second conductive path.

5. A component according to claim 4, wherein the insulated gate of the protection device is connected to a control circuit for independently applying a control signal to induce a conduction channel between the fifth and sixth regions to cause the voltage at the insulated gate of the insulated gate field effect device to alter so as to limit the current through the insulated gate field effect device.

6. A component according to claim 5, wherein the control circuit comprises a temperature sensor for providing the control signal when the temperature of the insulated gate field effect device exceeds a predetermined value.

7. A component according to claim 1, wherein the insulated gate field effect device comprises a number of device cells each having a second region defining a conduction channel area separating a respective third region from the first region and an insulated gate provided over the conduction channel area, the second regions of adjacent device cells being spaced apart from one another by the first region, and the insulated gates being connected together to form an insulated gate structure with sections of the insulated gate structure extending over the first region between adjacent second regions.

8. A component according to claim 7, wherein the second regions are of the opposite conductivity type and the device cells are formed by introducing at least some of the impurities to form the second regions using the insulated gate structure as a mask and wherein the protection device is formed by making the section of insulated gate structure between first and second adjacent device cells so narrow that the second regions of the first and second device cells merge to form the fourth region.

9. A component according to claim 8, wherein the region of each device cell has a central more highly doped subsidiary region which is omitted from the one of the first and second device cells in which the fifth region is situated.

10. A component according to claim 8, wherein the second regions of the device cells forming the protection device are smaller than the remaining device cells in a direction parallel to the width of the conductive path provided by the conduction channel area of the insulated gate field effect device.

11. A component according to claim 2, wherein the second conductive path is connected to the same potential as an electrode connected to the third region of the insulated gate field effect device.

12. A component according to claim 2, wherein the protection device comprises an insulated gate field effect transistor having a sixth region forming a potential barrier with the fourth region and being spaced from the fifth region by a conduction channel area of the fourth region, and an insulated gate adjoining the conduction channel area, the sixth region being electrically shorted to the fourth region by the second conductive path.

13. A component according to claim 3, wherein the protection device comprises an insulated gate field effect transistor having a sixth region forming a potential barrier with the fourth region and being spaced from the fifth region by a conduction channel area of the fourth region, and an insulated gate adjoining the conduction channel area, the sixth region being electrically shorted to the fourth region by the second conductive path.

14. A component according to claim 2, wherein the insulated gate field effect device comprises a number of device cells each having a second region defining a conduction channel area separating a respective third region from the first region and an insulated gate provided over the conduction channel area, the second regions of adjacent device cells being spaced apart from one another by the first region, and the insulated gates being connected together to form an insulated gate structure with sections of the insulated gate structure extending over the first region between adjacent second regions.

15. A component according to claim 3, wherein the insulated gate field effect device comprises a number of device cells each having a second region defining a conduction channel area separating a respective third region from the first region and an insulated gate provided over the conduction channel area, the second regions of adjacent device cells being spaced apart from one another by the first region, and the insulated gates being connected together to form an insulated gate structure with sections of the insulated gate structure extending over the first region between adjacent second regions.

16. A component according to claim 9, wherein the second regions of the device cells forming the protection device are smaller than the remaining device cells in a direction parallel to the width of the conductive path provided by the conduction channel area of the insulated gate field effect device.

* * * * *